United States Patent [19]

Sakaguchi

[11] Patent Number: 4,990,108
[45] Date of Patent: Feb. 5, 1991

[54] CONNECTOR DEVICE FOR CONNECTING ELECTRONIC COMPONENTS

[75] Inventor: Takahiro Sakaguchi, Kodaira, Japan

[73] Assignee: Teac Corporation, Japan

[21] Appl. No.: 424,666

[22] Filed: Oct. 20, 1989

[30] Foreign Application Priority Data

Oct. 27, 1988 [JP] Japan .................. 63-140242

[51] Int. Cl.$^5$ .......................... H01R 13/64
[52] U.S. Cl. ...................... 439/678; 439/56;
439/910
[58] Field of Search ............ 439/674, 677, 678, 679,
439/680, 681, 56, 489, 488, 490, 686, 660, 689,
701, 910, 912, 924

[56] References Cited

U.S. PATENT DOCUMENTS

| 3,233,207 | 2/1966 | Ahroni et al. | 439/678 X |
| 3,611,247 | 10/1971 | Adams et al. | 439/910 X |
| 4,318,578 | 3/1982 | Ericson et al. | 439/910 X |
| 4,549,036 | 10/1985 | Reichbach | 439/678 X |
| 4,606,597 | 8/1986 | Bielefeld | 439/490 |
| 4,820,193 | 4/1989 | Noorily | 439/488 |

FOREIGN PATENT DOCUMENTS 0589344 12/1933 Fed. Rep. of Germany ...... 439/679

Primary Examiner—Neil Abrams
Assistant Examiner—Khiem Nguyen
Attorney, Agent, or Firm—Andrus, Sceales, Starke & Sawall

[57] ABSTRACT

A connector device for electrically connecting an electronic component having a plurality of connection pins, each of the connection pins having a structure for distinguishing the polarity assigned to the pins, comprises a body provided with an insertion part adapted to accept the plurality of pins, an electrical contact member adapted to engage with the plurality of pins when the pins inserted into the connector have reached respective predetermined positions, and insertion prohibiting structure provided in correspondence to at least one of the connection pins so as to prevent the insertion of the pins to the predetermined positions when the pins are inserted the insertion part with a wrong polarity.

7 Claims, 3 Drawing Sheets 4,990,108

CONNECTOR DEVICE FOR CONNECTING ELECTRONIC COMPONENTS

BACKGROUND OF THE INVENTION

The present invention generally relates to connector devices for connecting electronic components and more particularly to a connector device suitable for connecting electronic components having a plurality of connection pins each having its own polarity.

Generally, electronic components such as light emitting diode (LED), which are frequently used in electronic apparatus such as magnetic or optical disk recording and/or reproducing system for visual display, are mounted on a circuit board held in the apparatus by inserting connection pins of the component into corresponding holes provided on the board and soldering the pins therein. Certain electronic components such as a large scale integrated circuit (LSI) are mounted on the circuit board via a connector provided on the printed circuit board by simply inserting connection pins to corresponding holes of the connector.

There are a number of electronic components such as LED, transistors and the like in which each of the connection pins has its own polarity. In this type of component, the connection has to be made while observing the polarity of the connection pins of the component. Usually, these electronic components have a plurality of connection pins each having an identical size and shape. Thus, there is a substantial risk that the pins are erroneously inserted into the holes in the connector at the time the electronic component is mounted on the connector.

SUMMARY OF THE INVENTION

Accordingly, it is a general object of the present invention to provide a novel and useful connector device in which the aforementioned problems are eliminated.

Another and more specific object of the present invention is to provide a connector device for electrical connection of an electronic component, wherein erroneous insertion of connection pins of the electronic component into the connector device is positively prevented.

Another object of the present invention is to provide a connector device for electrically connecting an electronic component having a plurality of connection pins, each of the connection pins having a structure for distinguishing the polarity assigned to the pins, comprising: a body provided with an insertion part adapted to accept said plurality of pins; an electrical contact member adapted to engage with said plurality of pins when the pins inserted into the connector have reached respective predetermined positions; and insertion prohibiting means provided in correspondence to at least one of said connection pins so as to prevent the insertion of the pins to said predetermined positions when the pins are inserted into the insertion part with a wrong polarity. According to the present invention, the insertion of the connection pins into the connector with wrong polarity is prohibited by the insertion prohibiting means and the erroneous mounting of the electronic component on the connector device is prevented. Associated therewith, the erroneous operation of the electronic component or damaging to the electronic component is positively prevented.

Other objects and further features of the present invention will become apparent from the following detailed description when read in conjunction with attached drawings.

DETAILED DESCRIPTION

Figure 1:
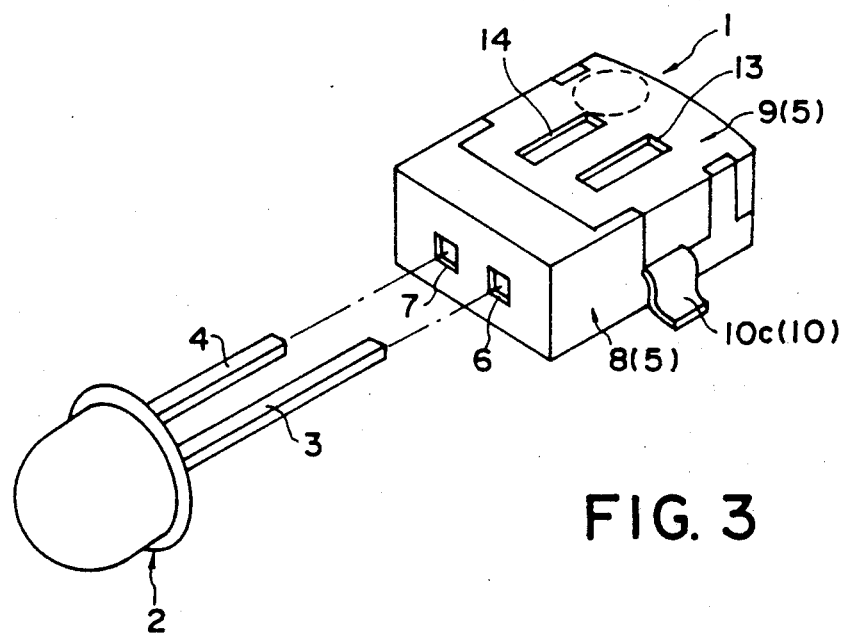
FIG. 1 is a perspective view showing a connector device according to an embodiment of the present invention.

FIG. 1 shows a perspective view of a connector 1 according to an embodiment of the present invention. Referring to the drawing, the connector 1 is designed to hold an LED 2 having a pair of connection pins 3 and 4 and to connect the LED 2 electrically to an external circuit such as a printed circuit board (not shown), in which the connection pin 3 corresponds to an anode pin and the connection pin 4 corresponds to a cathode pin of the LED. In use, the pins 3 and 4 are accepted in an insertion opening 6 and another insertion opening 7 respectively and thus the LED 2 is held by the connector 1 with the intended electrical connection with the printed circuit board.

Before describing the connector 1, the structural feature of the LED 2 will be described in brief. As is commonly known, the LED 2 or LED in general has a pair of connection pins such as the pins 3 and 4 each having its own polarity. Thus, when the pins 3 and 4 are connected to the connector 1 with a wrong polarity, the LED 2 does not only fail to emit light but may be damaged. Thus, the length of the pins 3 and 4 are made different so as to be able to distinguish the polarity of the pins. For example, the pin 3 for the anode of the LED is made longer than the pin 4 for the cathode.

Next, the connector 1 according to the present invention will be described. The connector 1 generally comprises a connector body 5 which in turn comprises a base 8 and a cover part 9, and a pair of contact members 10 and 11.

The base 8 and the cover part 9 are both made of a molded plastic, in which the base 8 is provided with a pair of insertion openings 6 and 7 at a front side of the base 8 for accepting the pins 3 and 4 of the LED 2. Further, there is formed a stopper part 12 behind the foregoing insertion openings 6 and 7. Furthermore, observation windows 13 and 14 to be described are formed on a top side of the cover part 9.

Figure 2:
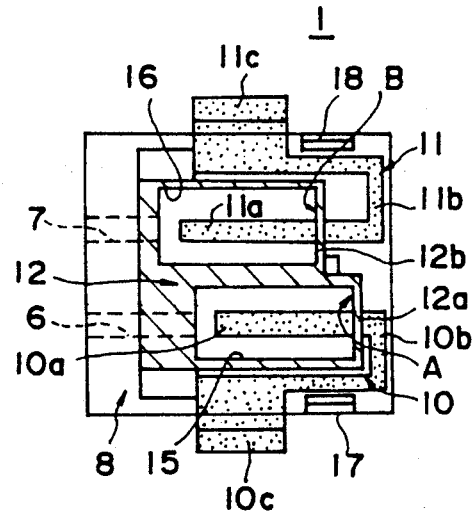
FIGS. 2 and 3 are diagrams showing the connector device of FIG. 1 in a state in which a cover part thereof is removed.
Figure 3:
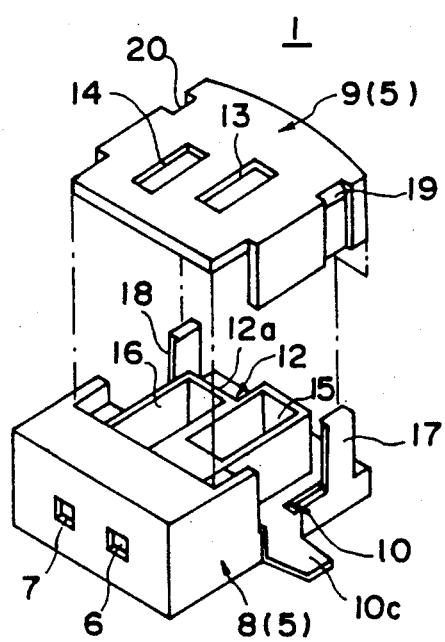

FIGS. 2 and 3 show the connector 1 in a state in which the cover part 9 is removed, in which FIG. 2 is a plan view of the connector 1 without the cover part 9 and FIG. 3 is an exploded perspective view of the connector 1.

The contact members 10 and 11, matted in FIG. 2 for easy visual recognition, are stamped from a metal sheet and have a generally U-shaped form in the plan view. Thus, the contact members 10 and 11 respectively comprise contact parts 10a and 11a, lead parts 10b and 11b, and terminal parts 10c and 11c, in which the contact parts 10a and 11a are formed so as to engage with the pins 3 and 4 when the LED 2 is mounted on the connector 1. The parts 10a and 11a are provided above the top surface of the base 8 with a minute separation therefrom so as to allow the insertion of the pins 3 and 4 between the contact parts and the top surface of the base 8 (see FIG. 6). The lead parts 10b and 11b are formed in conformance with the base 8 and are held therein at the time the base is molded. The terminal parts 10c and 11c extend laterally from both sides of the base 8 and are soldered on a printed circuit board and the like (not shown).

Next, the contact parts 10a and 11a will be described in more detail with reference to FIG. 2. As shown in the drawing, the contact parts 10a and 11a are not identical to each other but different such that the contact part 11a is longer than the contact part 10a and the contact part 11a extends to a position closer to the front side as compared to the contact part 10a. The length of the contact parts 10a and 11a are changed in correspondence to the length of the pins 3 and 4. When the LED 2 is mounted properly, the longer anode pin 3 is engaged with the contact part 10a and the shorter cathode pin 4 is engaged with the contact part 11a. When the LED 2 is properly mounted, the tip end of the pin 3 reaches a position A shown in FIG. 3 in which the tip end makes a contact engagement with a wall 12a of the stopper part 12. Further, the tip end of the pin 4 reaches a position B shown in FIG. 3 in which the tip end makes a contact with a wall 12b of the stopper part 12. Note that the wall 12a and the wall 12b are provided in correspondence to the tip end of the pins 3 and 4 of the LED 2 provided that the LED 2 is properly mounted on the connector 1.

Figure 6:
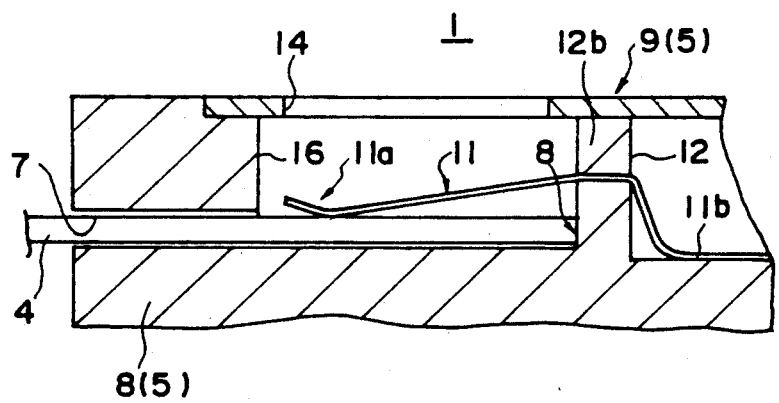
FIG. 6 is a cross sectional view taken along a line C—C in FIG. 4.

Next, the stopper part 12 will be described. For the sake of easy recognition, the stopper part 12 is hatched in FIG. 2. This stopper part 12 is formed unitarily to the base 8 and has a pair of depressions 15 and 16 opening upward. The depressions 15 and 16 are so formed such that the contact part 10a is located within the depression 15 and such that the contact part 11a is located within the depression 16. As shown in FIG. 6, the contact parts 10a and 11a extend in a direction opposite to the insertion openings 6 and 7 and reaches the inside of the depressions 15 and 16 by penetrating through the walls 12a and 12 respectively.

As shown in the exploded view of FIG. 3, the connector 1 is completed after mounting the cover part 9 on the base 8. For this purpose, the base 8 is provided with mounting pieces 17 and 18 and the cover part 9 is provided with corresponding engaging grooves 19 and 20. Thus, the mounting of the cover part 9 can be done simply and the connector can be assembled easily. Further, the observation windows 13 and 14 are formed such that they register with the depressions 15 and 16 when the cover part 9 is mounted on the base 8. Thus, one can visually inspect the state of the contact parts 10a and 11a inside the body 5 through the observation windows 13 and 14.

From here on, the function of the connector 1 having the foregoing construction will be described with reference to FIGS. 4 through 6. Note that FIGS. 4 and 5 are partial cross sectional view in a state in which the cover part 9 is removed, and FIG. 6 is a cross sectional view taken along a C—C line of FIG. 4 in a state that the cover part 9 is provided.

Figure 4:
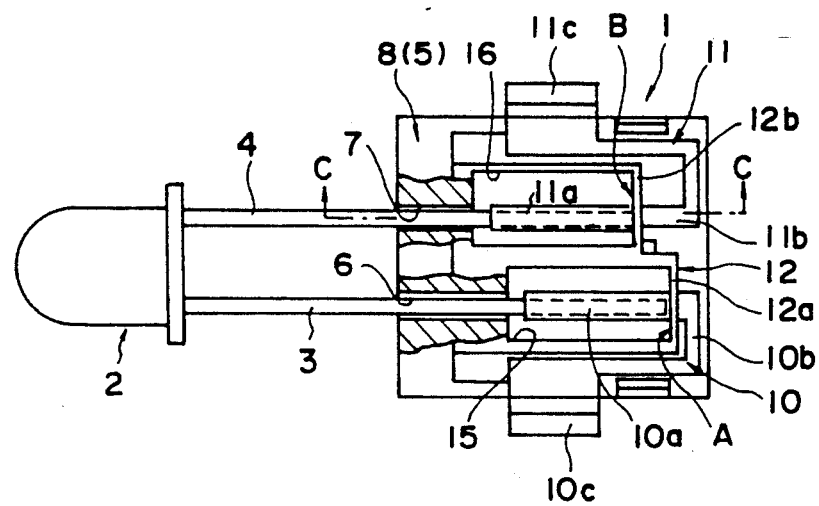
FIG. 4 is a view of the device of FIG. 1 showing a state in which an LED is mounted with a proper polarity.

FIG. 4 shows the properly mounted state of the LED 2 in which the pins 3 and 4 are properly inserted into the corresponding insertion openings 6 and 7. As the contact parts 10a and 11a as well as the stopper part 12 are constructed in correspondence to the length of the pins 3 and 4 as already described, the pins 3 and 4 are inserted to the predetermined positions A and B and make a contact with the contact members 10 and 11. At the same time, the pins 3 and 4 and thus the LED 2 are held firmly by the connector 1 between the top surface of the base 8 and the contact part 10 or the contact part 11 as shown in FIG. 6. When the LED 2 is further pressed into the connector 1 in the foregoing state such that the pins 3 and 4 are urged more deeply into the insertion openings 6 and 7, the movement of the pins 10 and 11, abutting with the walls 12a and 12b, is prevented.

Figure 5:
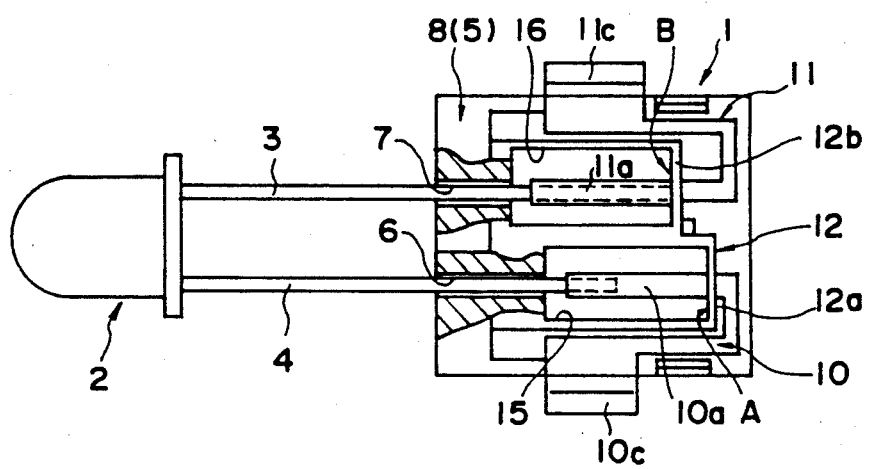
FIG. 5 is a view similar to FIG. 4 showing a state in which the LED is mounted with a wrong polarity.

FIG. 5, on the other hand, shows a state in which the contact pins 3 and 4 are inserted erroneously. Thus, the pin 3 is accepted in the contact hole 7 and the pin 4 is accepted in the contact hole 6. In this state, as the predetermined position B of the contact part 11a is located at a side closer to the front side of the base 8 than the contact part 10a and as the longer anode contact pin 3 is engaged with the contact part 11a in the insertion opening 7, the insertion of the pins 3 and 4 is prohibited once the tip end of the pin 3 is reached the predetermined position B. As a result, the person inserting the LED 2 to the connector 1 can know that the direction of the insertion is wrong. Associated therewith, the failure of light emission of the LED or the damage to the LED can be positively prevented. Further, as one can inspect the state of the contact parts 10a and 11a from outside through the observation windows 13 and 14, the erroneous mounting of the LED can be checked visually. Note that the contact parts 10a and 11a are displaced upwards responsive to the insertion of the pins 3 and 4 as can be seen in FIG. 6. Thus, the state of the contact parts 10a and 11a reflects the state of insertion of the pins 3 and 4 into the insertion openings 6 and 7. Note that the wall 12a for engagement of the longer pin 3 may be omitted.

Figure 7:
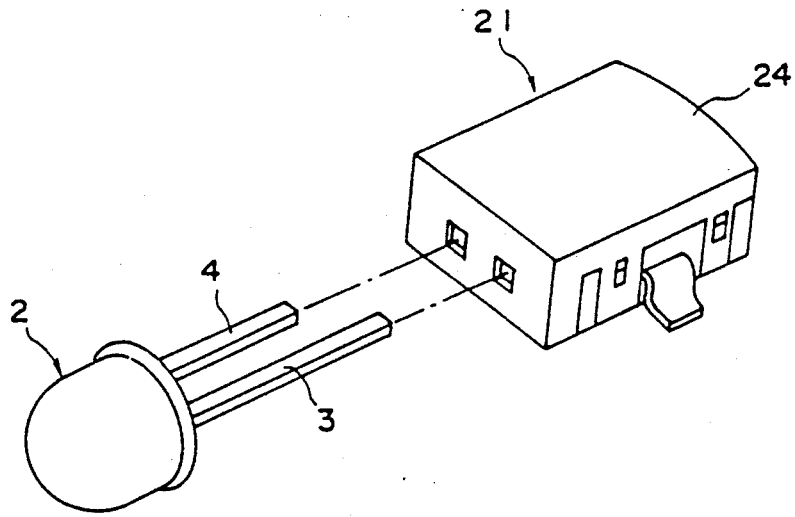
FIGS. 7 and 8A–8C are diagrams showing modifications of the connector device of FIG. 1.
Figure 8C:
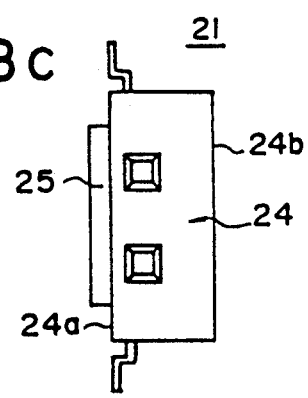
Figure 8A:
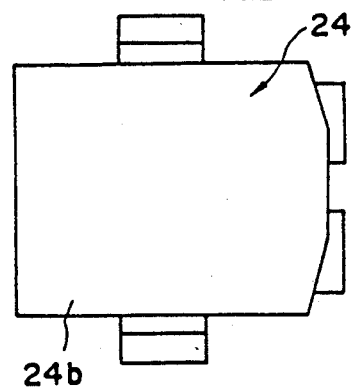
Figure 8B:
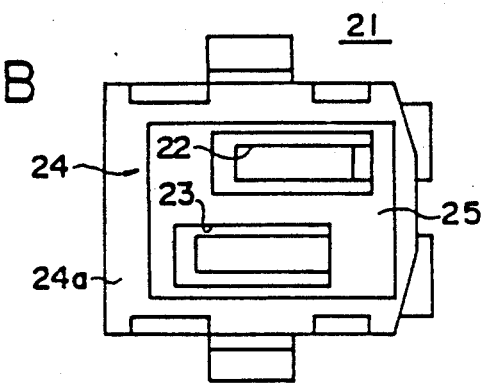

FIGS. 7 and 8 show another connector 21 which is a modification of the connector 1. This connector 21 has a feature in that it has a pair of observation windows 22 and 23 at a bottom surface 24a of a body 24 of the connector and that the body 24 has a flat top surface 24b. In order to realize the foregoing construction, the base, cover part, stopper member, contact member and the like are provided upside down with respect to the connector 1. Thus, the connection pins are accepted above the contact parts. As the engagement of the pins and the contact parts is obvious by viewing FIG. 6 upside down, the illustration of the interior of the connector 21 will be omitted.

This connector 21 having the flat top surface 24b is suitable for a commonly practised assembling process in which components are transported by an air suction nozzle which holds the component by the pressure of air sucked into the nozzle. After the connector 21 is brought into a predetermined position of the printed circuit board, the connector is fixed thereon by soldering. This method of transporting the connector may be applicable also to the connector 1 of the first embodiment, though with limitation. As the connector 1 has the observation windows 13 and 14 on the top of the cover part 9, the area in which the air suction nozzle can engage is relatively limited as shown in a broken circle in FIG. 1. When the area for engagement with the air suction nozzle is small as such, there is a risk that the connector is fallen from the nozzle during the transportation. In the case of the connector 21 where the observation windows 22 and 24 are provided on the bottom surface 24a, all of the top surface 24b can be used for engagement with the nozzle and the foregoing problems are eliminated. In a further preferred modification of the connector 21 of FIG. 7, one may provide a projected part 25 at the bottom surface 24a and provide the observation windows 22 and 23 in the projected part 25. By providing a corresponding opening in the printed circuit board so as to accept the projected part 25, one can inspect the state of the contacts through the observation windows from the bottom of the printed circuit board. At the same time, an exact positioning of the connector on the printed circuit board can be achieved by engaging the projected part 25 with the corresponding opening.

Although it has been assumed in the foregoing description that the pins 3 and 4 of the LED 2 have different lengths for the discrimination of polarity, the present invention is not limited to such construction of the electronic component but may be applicable to a component in which the thickness or cross section of the connection pins is changed for the discrimination of the polarity. Further, the electronic component which is applicable to the connector of the present invention is not limited to the LED 2 having a pair of connection pins 3 and 4 but may be applicable to other electronic components having a number of connection pins. In such a case where the electronic component has more than two connection pins, it is not necessary to change the size or shape of the connection pins for all of the pins therein. For example, in a case of an electronic component having ten pins in a row, the discrimination of the polarity can be achieved by changing the length of the pins at both ends.

Further, the connector of the present invention is not limited to the construction shown in FIG. 6 in which the connection pins 3 and 4 are accepted below the contact parts 10a and 11a but the connector may be constructed such that the connection pins 3 and 4 are accepted above the contact parts 10a and 11a. By constructing the connector as such, the inspection of the state of the connection becomes even easier as the connection pins can be observed directly through the windows 13 and 14 from the outside.

Further, by choosing the length of the connection pins 3 and 4 appropriately, one can construct the connector such that at least one of the pins 3 and 4 does not make contact with the contact parts 10a and 10b when the LED 2 is inserted with erroneous polarity. Note that in the the example of FIG. 5, both of the pins 3 and 4 make a contact with the contact parts 10a and 10b even when the LED 2 is inserted with erroneous polarity.

According to the connector of the present invention, the insertion of the connection pins up to the predetermined positions for establishing a proper electrical connection is prohibited by the insertion prohibiting means unless the pins are inserted with the proper polarity. As a result, erroneous mounting of the electronic component on the connector is discovered at the time the component is mounted and the erroneous operation of the electronic component or damage to the electronic component due to the erroneous mounting of the component is positively prevented.

Further, the present invention is not limited to these embodiments but various variations and modifications may be made without departing from the scope of the invention.

What is claimed is:

1. A connector device for electrically connecting an electronic component having a plurality of connection pins, each of the connection pins having a length which is different so that the polarity assigned to the pins can be discriminated, comprising:
    a body provided with an insertion part adapted to accept said plurality of pins;
    an electrical contact member adapted to engage with said plurality of pins when the pins inserted into the connector have reached respective predetermined positions; and
    insertion prohibiting means provided unitarily with the body of the connector device in correspondence to at least one of said connection pins so as to prevent the insertion of the pins to said predetermined positions when the pins are inserted into the insertion part with a wrong polarity, said insertion prohibiting means comprising a stopper part provided at a predetermined insertion depth of one of the pins, said stopper making a contact engagement with a pin properly inserted to said predetermined insertion depth and prohibiting further insertion of the pin.

2. A connector device as claimed in claim 1 in which said body is provided with an observation window for inspecting a state of insertion of the pins from an outside of the body.

3. A connector device as claimed in claim 2 in which said observation window is provided on either one of a top surface and a bottom surface of the body.

4. A connector device as claimed in claim 1 in which said electrical contact member comprises a contact part adapted to contact electrically with the inserted pins of the electronic component, a lead part for mounting the contact member on the body of the connector device, and a terminal part extending beyond the body of the connector device for electrical connection with an external electrical circuitry.

5. A connector device as claimed in claim 4 in which said contact part is provided with an offset in a direction of insertion of the pins in correspondence to the structure of the pins.

6. A connector device as claimed in claim 4 in which said contact part is configured so as to accept the pin of the electronic component below the contact part.

7. A connector device as claimed in claim 4 in which said contact part is configured so as to accept the pin of the electronic component above the contact part.

* * * * *